US007997227B2

(12) United States Patent  
Bruce et al.

(10) Patent No.: US 7,997,227 B2  
(45) Date of Patent: Aug. 16, 2011

(54) VACUUM COATER DEVICE AND MECHANISM FOR SUPPORTING AND MANIPULATING WORKPIECES IN SAME

(75) Inventors: Robert William Bruce, Loveland, OH (US); Theodore Robert Grossman, Hamilton, OH (US); John Douglas Evans, Sr., Springfield, OH (US); Brian Harvey Pilsner, Mason, OH (US)

(73) Assignee: General Electric Company, Schenectady, NY (US)

(*) Notice: Subject to any disclaimer, the term of this patent is extended or adjusted under 35 U.S.C. 154(b) by 929 days.

(21) Appl. No.: 11/685,354

(22) Filed: Mar. 13, 2007

(65) Prior Publication Data

US 2008/0223291 A1    Sep. 18, 2008

(51) Int. Cl.
- C23C 16/448   (2006.01)
- C23C 16/458   (2006.01)
- C23C 16/48    (2006.01)
- C23F 1/00     (2006.01)
- H01L 21/306   (2006.01)
- C23C 16/06    (2006.01)
- C23C 16/30    (2006.01)

(52) U.S. Cl. ........ 118/723 EB; 118/723 R; 156/345.54; 156/345.55; 156/345.4

(58) Field of Classification Search ............ 118/723 EB, 118/723 R; 156/345.54, 345.55, 345.4  
See application file for complete search history.

(56) References Cited

U.S. PATENT DOCUMENTS

| | | | | |
|---|---|---|---|---|
| 4,124,411 A * | 11/1978 | Meuleman et al. | ........... | 136/258 |
| 4,683,149 A * | 7/1987 | Suzuki et al. | ................ | 427/528 |
| 4,733,091 A * | 3/1988 | Robinson et al. | ........... | 250/492.2 |
| 4,777,908 A * | 10/1988 | Temple et al. | ................ | 118/719 |
| 4,817,559 A * | 4/1989 | Ciparisso | ....................... | 118/731 |
| 4,868,003 A * | 9/1989 | Temple et al. | ................ | 118/719 |
| 4,951,604 A * | 8/1990 | Temple et al. | ........... | 118/723 EB |
| 5,055,318 A * | 10/1991 | Deutchman et al. | ........... | 427/534 |
| 5,342,448 A * | 8/1994 | Hamamura et al. | ..... | 118/723 FI |
| 5,492,605 A * | 2/1996 | Pinarbasi | ................ | 204/192.11 |
| 5,656,141 A * | 8/1997 | Betz et al. | ................. | 204/298.05 |
| 5,791,851 A | 8/1998 | Kempf et al. | | |
| 5,871,805 A * | 2/1999 | Lemelson | .................... | 427/8 |
| 5,898,179 A * | 4/1999 | Smick et al. | ............. | 250/492.21 |
| 5,985,036 A | 11/1999 | Anderle | | |
| 6,056,826 A | 5/2000 | Rick et al. | | |
| 6,063,244 A * | 5/2000 | Pinarbasi | ................. | 204/192.11 |
| 6,083,322 A | 7/2000 | Burns et al. | | |
| 6,086,727 A * | 7/2000 | Pinarbasi | ................. | 204/192.11 |
| 6,142,097 A * | 11/2000 | Tomofuji | ................ | 118/723 VE |

(Continued)

*Primary Examiner* — Rudy Zervigon  
(74) *Attorney, Agent, or Firm* — Marcella Louke; David J. Clement; Trego, Hines & Ladenheim, PLLC (57) ABSTRACT

An apparatus for providing a vacuum coating to a workpiece, including: a coating chamber containing a coating material, with the coating chamber being operable at an elevated temperature and a sub-atmospheric pressure; an electron beam gun projecting an electron beam into the coating chamber and onto the coating material, where the electron beam gun is operable to melt the coating material and to evaporate molten coating material; and, a mechanism for supporting manipulating the workpiece in the coating chamber. The supporting mechanism further includes: a coupling device for retaining the workpiece; a joint connected to the coupling device enabling movement of the workpiece in all directions; an intermediate member connecting the coupling device and the joint; and, a device connected to the intermediate member for moving the workpiece in a designated vertical plane. The supporting mechanism may also include a device connected to the intermediate member for moving the workpiece in a designated horizontal plane.

24 Claims, 10 Drawing Sheets

U.S. PATENT DOCUMENTS

| | | | |
|---|---|---|---|
| 6,145,470 A | 11/2000 | Bruce et al. | |
| 6,163,033 A * | 12/2000 | Smick et al. | 250/441.11 |
| 6,238,531 B1 * | 5/2001 | Pinarbasi | 204/298.04 |
| 6,437,351 B1 * | 8/2002 | Smick et al. | 250/492.21 |
| 6,478,931 B1 * | 11/2002 | Wadley et al. | 204/192.12 |
| 6,599,084 B1 | 7/2003 | Schutz et al. | |
| 6,765,219 B2 * | 7/2004 | Berrian et al. | 250/492.21 |
| 6,863,937 B2 | 3/2005 | Bruce et al. | |
| 6,903,348 B2 * | 6/2005 | Jang et al. | 250/492.21 |
| 6,923,868 B2 * | 8/2005 | Grechanyuk et al. | 118/719 |
| 6,946,034 B1 | 9/2005 | Bruce et al. | |
| 6,964,559 B2 | 11/2005 | Behling et al. | |
| 6,983,718 B1 | 1/2006 | Bruce et al. | |
| 7,030,395 B2 * | 4/2006 | Deak, IV | 250/492.21 |
| 2001/0055653 A1 | 12/2001 | Dopper | |
| 2004/0018303 A1 | 1/2004 | Bruce et al. | |
| 2005/0180737 A1 * | 8/2005 | Kurita et al. | 392/418 |
| 2008/0223291 A1 * | 9/2008 | Bruce et al. | 118/50.1 |

* cited by examiner

VACUUM COATER DEVICE AND MECHANISM FOR SUPPORTING AND MANIPULATING WORKPIECES IN SAME

BACKGROUND OF THE INVENTION

The present invention relates generally to a vacuum coater device and, in particular, to a mechanism for supporting and manipulating the workpieces within the coating chamber of such vacuum coater device.

It will be appreciated that many parts in a gas turbine engine, including those in the high pressure turbine, combustor, and augmentor, are subjected to high temperatures. In order to enable such components to withstand such environment, it has been found desirable to apply a thermal barrier coating thereto (e.g., a durable physical vapor deposition (PVD) thermal barrier coating (TBC)). This is typically accomplished by means of a specialized device known as a vacuum coating apparatus, where the parts are subject to various process steps during the application cycle. Such process steps generally include loading the workpieces into the vacuum coating apparatus, heating the workpieces to a predetermined temperature, coating the workpieces in a desired manner, and unloading the workpieces from the vacuum coating apparatus.

The prior art discloses vacuum coaters which have performed the described process steps in essentially a linear fashion, where the workpieces are transported directly from one station to the next. One particular configuration is disclosed in U.S. Pat. Nos. 6,946,034 and 6,863,937 to Bruce et al., which is owned by the assignee of the present invention and is hereby incorporated by reference. These patents disclose a physical vapor deposition apparatus having a symmetrical arrangement with a preheat chamber and a loading chamber located on each side of a coating chamber. In this design, a rake unit loaded with parts to be coated may enter from either side of the coating chamber. This arrangement is inherently more efficient that an apparatus having a single linear load capability. Besides allowing a second rake unit to be heated in the preheat chamber while a first rake unit is undergoing the process in the coating chamber, additional rake units may be loaded with parts in the adjacent loading chamber.

One important aspect of coating the workpieces in a vacuum coating apparatus involves the ability to provide the proper coating distribution, particularly when such workpiece has a complex configuration. In order to do so, it has been found that the workpieces are preferably rotated and/or oscillated so as to achieve deposition of the coating material on all surfaces in a desired manner. U.S. Pat. No. 6,056,828 to Rick et al. and U.S. Pat. No. 5,985,036 to Anderle disclose exemplary devices for rotating and shifting movement of a substrate.

It has been found, however, that the mechanisms for supporting and manipulating the workpieces within the coating chamber of a vacuum coating apparatus are inherently complex and costly. This stems primarily from the remote location of the drive systems from the workpiece holders, thereby requiring a network of shafts and bevel gears to traverse the distance therebetween. Further, a dual shafted system is typically utilized to protect the mechanism against the harsh environment of the coating chamber.

Accordingly, it would be desirable for a vacuum coating apparatus to be developed which improves the support and manipulation of workpieces within the coating chamber. Besides producing the desired coating distribution, it would also be desirable for such configuration to be less complex and less costly than the current oscillating system. Of course, it would be also expected that such a mechanism work efficiently with the requirements of the electron beam guns therein.

BRIEF SUMMARY OF THE INVENTION

In accordance with a first exemplary embodiment of the invention, an apparatus for providing a vacuum coating to a workpiece is disclosed as including: a coating chamber containing a coating material, with the coating chamber being operable at an elevated temperature and a sub-atmospheric pressure; an electron beam gun projecting an electron beam into the coating chamber and onto the coating material, where the electron beam gun is operable to melt the coating material and to evaporate molten coating material; and, a mechanism for supporting and manipulating the workpiece in the coating chamber. The supporting mechanism further includes: a coupling device for retaining the workpiece; a joint connected to the coupling device enabling movement of the workpiece in all directions; an intermediate member connecting the coupling device and the joint; and, a device connected to the intermediate member for moving the workpiece in a designated vertical plane. The supporting mechanism may also include a device connected to the intermediate member for moving the workpiece in a designated horizontal plane.

In a second exemplary embodiment of the invention, an apparatus for providing a vacuum coating to a workpiece is disclosed as including: a coating chamber containing a coating material, with the coating chamber being operable at an elevated temperature and a sub-atmospheric pressure; an electron beam gun projecting an electron beam into the coating chamber and onto the coating material, where the electron beam gun is operable to melt the coating material and to evaporate molten coating material; and, a mechanism for supporting and manipulating the workpiece in the coating chamber. The supporting mechanism further includes: a coupling device for retaining the workpiece; a joint connected to the coupling device enabling movement of the workpiece in all directions; an intermediate member connecting the coupling device and the joint; and, a device connected to the joint for moving the workpiece in a designated vertical plane.

DETAILED DESCRIPTION OF THE INVENTION

Figure 1:
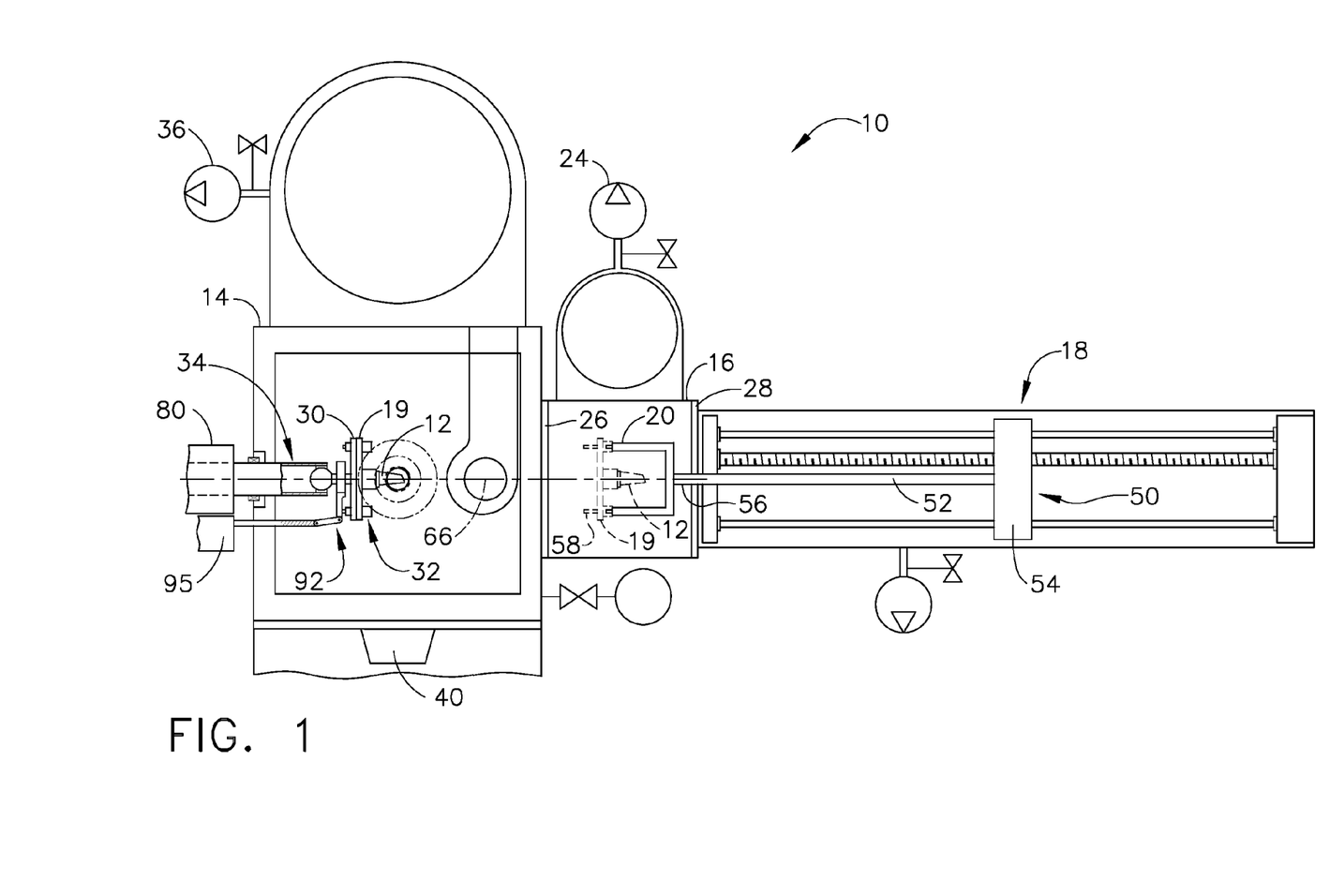
FIG. 1 is a partial top plan view of a vacuum coating apparatus, where a workpiece is depicted as having been moved from a heating chamber to within a coating chamber.

Referring now to the drawings in detail, wherein identical numerals indicate the same elements throughout the figures, FIG. 1 depicts a vacuum coating apparatus 10 which is utilized to apply a thermal barrier coating to workpieces 12 provided therein. More specifically, vacuum coating apparatus 10 preferably includes a substantially rectangular coating chamber 14 with at least one adjacent loading chamber 16, and a mechanism 18 for transporting at least one workpiece 12 into and out of coating chamber 14. Coating chamber 14 is operable at an elevated temperature and a sub-atmospheric pressure in order to produce and deposit vapors of a coating material on workpiece 12.

Figure 2:
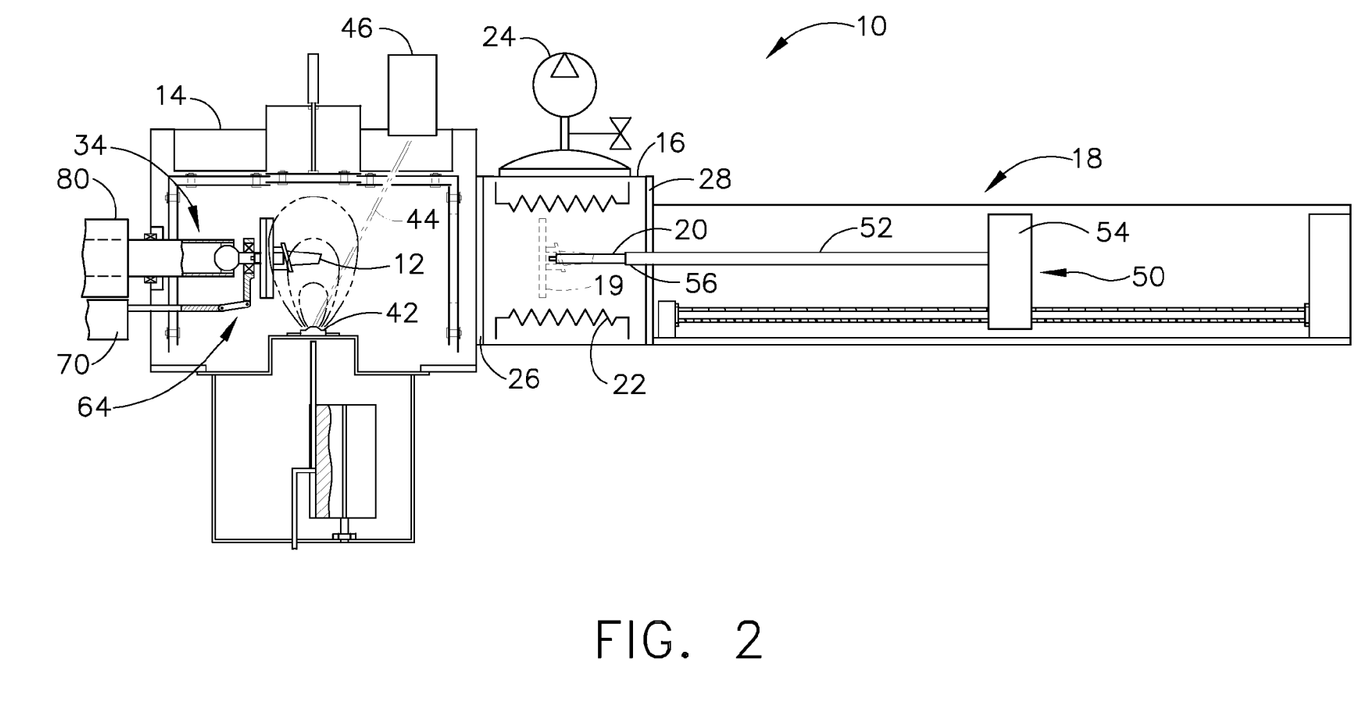
FIG. 2 is a front elevation view of the vacuum coating apparatus depicted in FIG. 1, where the workpiece is depicted as being positioned within a coating chamber.

It will be appreciated from FIGS. 1 and 2 that workpiece 12 is preferably connected to a first plate member 19 which is loaded onto a rake unit 20. Transporting mechanism 18 is then able to move rake unit 20 between loading chamber 16 and coating chamber 14. Loading chamber 16 preferably includes pre-heating elements 22 (or infrared lamps) for outgassing first plate member 19, rake unit 20, and workpiece 12. It will also be noted that a roughing pump 24 is preferably associated with loading chamber 16 in order to facilitate pumping therein after rake unit 20 has been loaded. A two way vacuum valve 26 is preferably provided adjacent a first side of coating chamber 14 between loading chamber 16 and coating chamber 14, where initially valve 26 is closed, loading chamber 16 is vented, and a valve 28 associated with loading chamber 16 is opened so that rake unit 20 is brought into loading chamber 16. Afterward, valve 28 is closed and a desired vacuum condition in loading chamber 16 is initiated. When loading chamber 16 is sufficiently outgassed and heated, and an appropriate vacuum is attained, two way vacuum valve 26 is opened.

With respect to transporting mechanism 18, it will be noted that such device first grabs rake unit 20 and pushes it from loading chamber 16 into coating chamber 14, where first plate member 19 retaining workpiece 12 preferably attaches to a second plate member 30 having a specially configured coupling device 32 and is released. In this way, first plate member 19, and consequently workpiece 12, is then connected to a mechanism 34 which supports and manipulates workpiece 12 (e.g., rotation, oscillation, tilting or other movement) during the coating process. It will also be appreciated that coating chamber 14 preferably includes a separate vacuum pump 36 associated therewith to maintain the desired vacuum condition therein. A heat shield (not shown) may also optionally be provided between coating chamber 14 and loading chamber 16 as well. A viewing port 40 is preferably provided for coating chamber 14 so that workpieces 12 may be monitored during the coating process.

It will be seen from the figures that coating of workpiece 12 is performed within coating chamber 14 by melting and evaporating at least one ingot 42 of ceramic material with an electron beam 44 produced by at least one electron beam gun 46 focused on ingots 42. Intense heating of the ceramic material by electron beam 44 causes the surface of each ingot 42 to melt, forming molten ceramic pools from which molecules of the ceramic material evaporate, travel upwardly, and then deposit on the surfaces of workpieces 12, producing the desired ceramic coating whose thickness will depend on the duration of the coating process. It will be appreciated that one or more ingots 42 may be present and evaporated at any given time.

After the coating process for workpiece 12 has been completed, transporting mechanism 18 then removes workpiece 12 from coating chamber 14 and re-positions it within loading chamber 16. This operation involves opening valve 26 and retracting any heat shield, releasing first plate member 19 from second plate member 30 and coupling device 32, connecting first plate member 19 to rake unit 20, and pulling first plate member along with workpiece 12 back into loading chamber 16. Rake unit 20, first plate member 19 and workpiece 12 may be permitted to cool for a predetermined time period, but typically are removed from loading chamber 16 and vacuum coating apparatus 10 by means of a door (or valve) upon venting of loading chamber 16.

With respect to transporting mechanism 18, it will be seen that a manipulator arm 50 is preferably included therewith to grab rake unit 20, where manipulator arm 50 is movable in a manner so that rake unit 20 can be pushed into and pulled out of coating chamber 14. Manipulator arm 50 preferably includes a main portion 52 which has a first end 54 and a second end 56. It will be appreciated that rake unit 20 is coupled to second end 56 of main portion 52.

It will further be noted that first plate member preferably includes a coupling mechanism 58 associated therewith. Coupling mechanism 58, which may be in the form of locking pin members, functions to dock first plate member 19 with a respective mating coupling device 32 associated with second plate member 30 in coating chamber 14. As indicated herein, first plate member 19 is retained to second plate member 30 so that manipulator arm 50 may be retracted from coating chamber 14 while the desired operation takes place therein.

Figure 3:
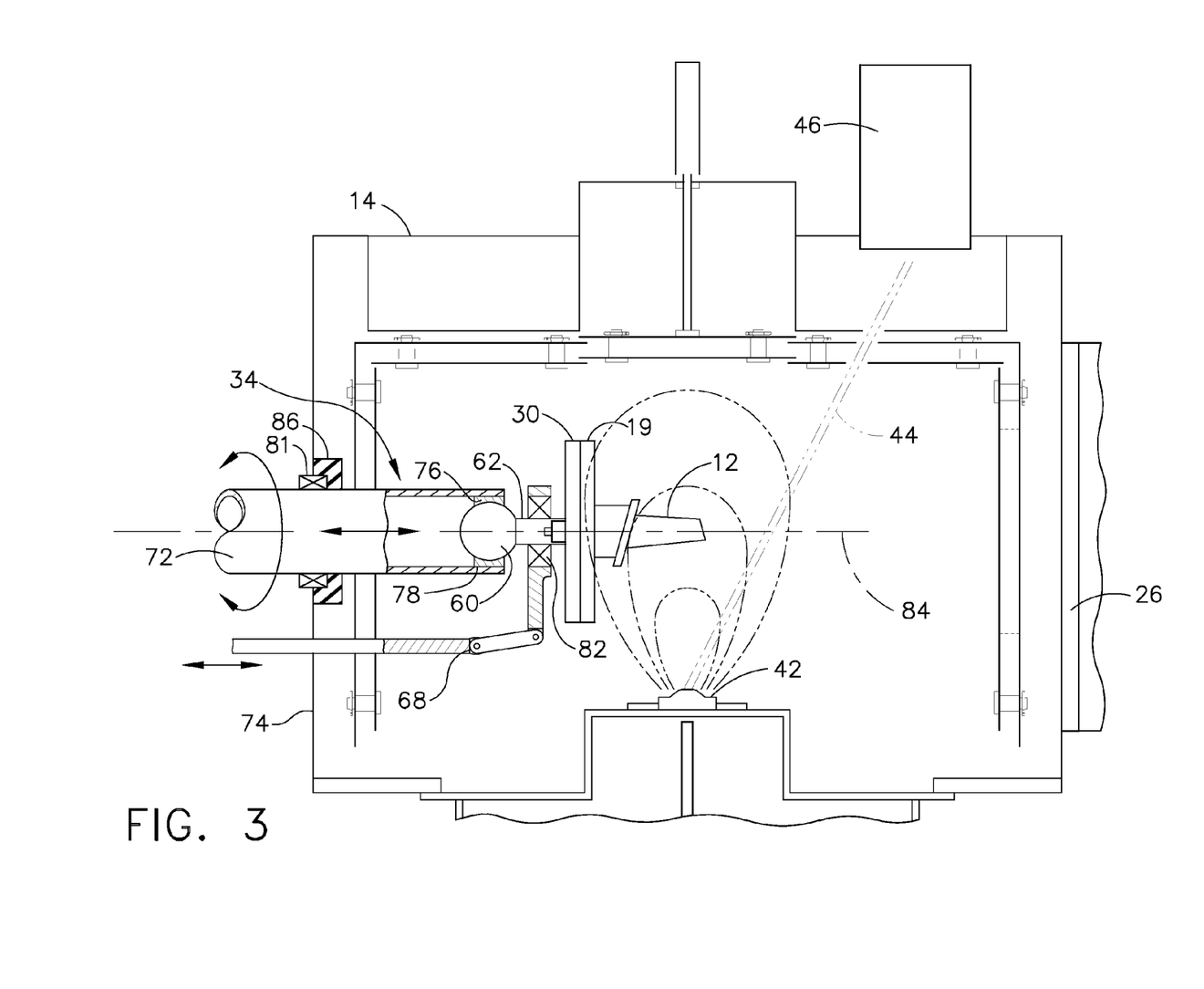
FIG. 3 is an enlarged, front elevation view of the vacuum coating apparatus depicted in FIGS. 1 and 2, where a workpiece is shown as being engaged with a mechanism for supporting and manipulating the workpiece within the coating chamber.

More specifically, support mechanism 34 includes second plate member 30, a joint 60 which preferably is capable of moving in all directions, an intermediate member 62 connecting second plate member 30 and joint 60, and a device 64 connected to intermediate member for moving second plate member 30 (and thereby workpiece 12) within a designated plane. While joint 60 is depicted as a ball joint, a universal joint may also be utilized. As identified in FIG. 1 and shown best in FIGS. 3 and 4, workpiece 12 may be tilted within a designated vertical plane 66 by means of a first linkage mechanism 68 which is operated by a corresponding first drive system 70. It will be seen that first linkage mechanism 68, as well as the connection to intermediate member 62, is located inside coating chamber 14 and drive system 70 is preferably located external to coating chamber 14.

Further, it will be noted that a shaft member 72 extends through a wall 74 of coating chamber 14 so that joint 60 is retained within a socket 76 positioned at an end 78 thereof. It will be appreciated that shaft member 72 is preferably connected to a drive system 80 which causes rotation thereof, as well as workpiece 12 by means of the connection between joint 60, intermediate member 62, and first and second plate members 19 and 30. A bearing 81 is provided at the interface of shaft member 72 and coating chamber wall 74 to enable rotation, as is a bearing 82 between intermediate member 62 and first linkage mechanism 68. In this way, workpiece 12 can be tilted within a designated vertical plane 66 and be rotated. It will be appreciated that a centerline axis 84 through support mechanism 34, and particularly through shaft member 72, joint 60, intermediate member 62 and first linkage mechanism 68, generally lies within a vertical plane that is substantially coincident with designated vertical plane 66. In addition, it will be appreciated that drive system 80 is preferably located external to coating chamber 14.

In order to permit shaft member 72 to extend into coating chamber 14 without affecting the desired vacuum condition therein, it is preferred that a high temperature seal 86 be positioned between shaft member 72 and the opening in coating chamber wall 74. One type of seal which functions in a satisfactory manner is a magnetic particle seal.

Figure 4:
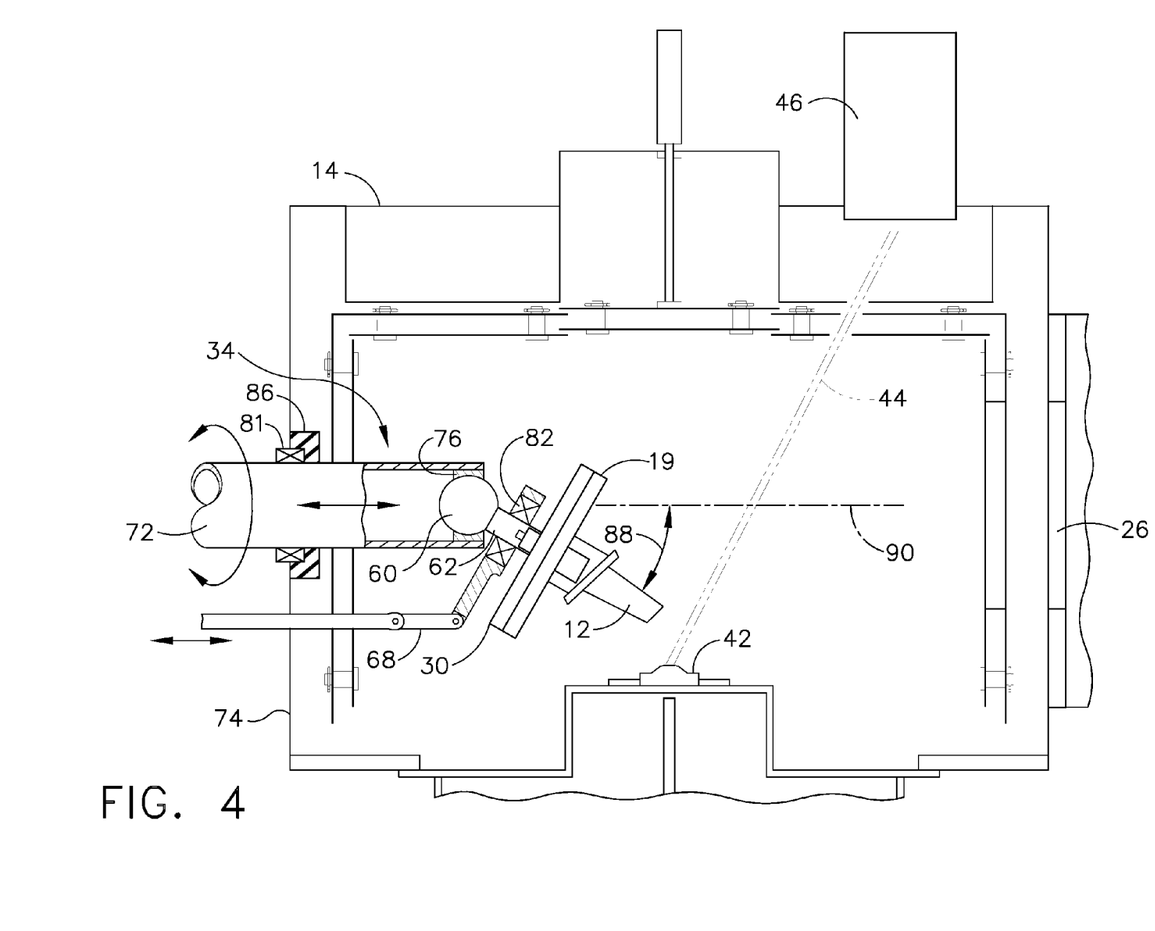
FIG. 4 is an enlarged, front elevation view of the vacuum coating apparatus depicted in FIGS. 1-3, where the workpiece is shown as being tilted at an angle to a horizontal plane through the coating chamber.
Figure 5:
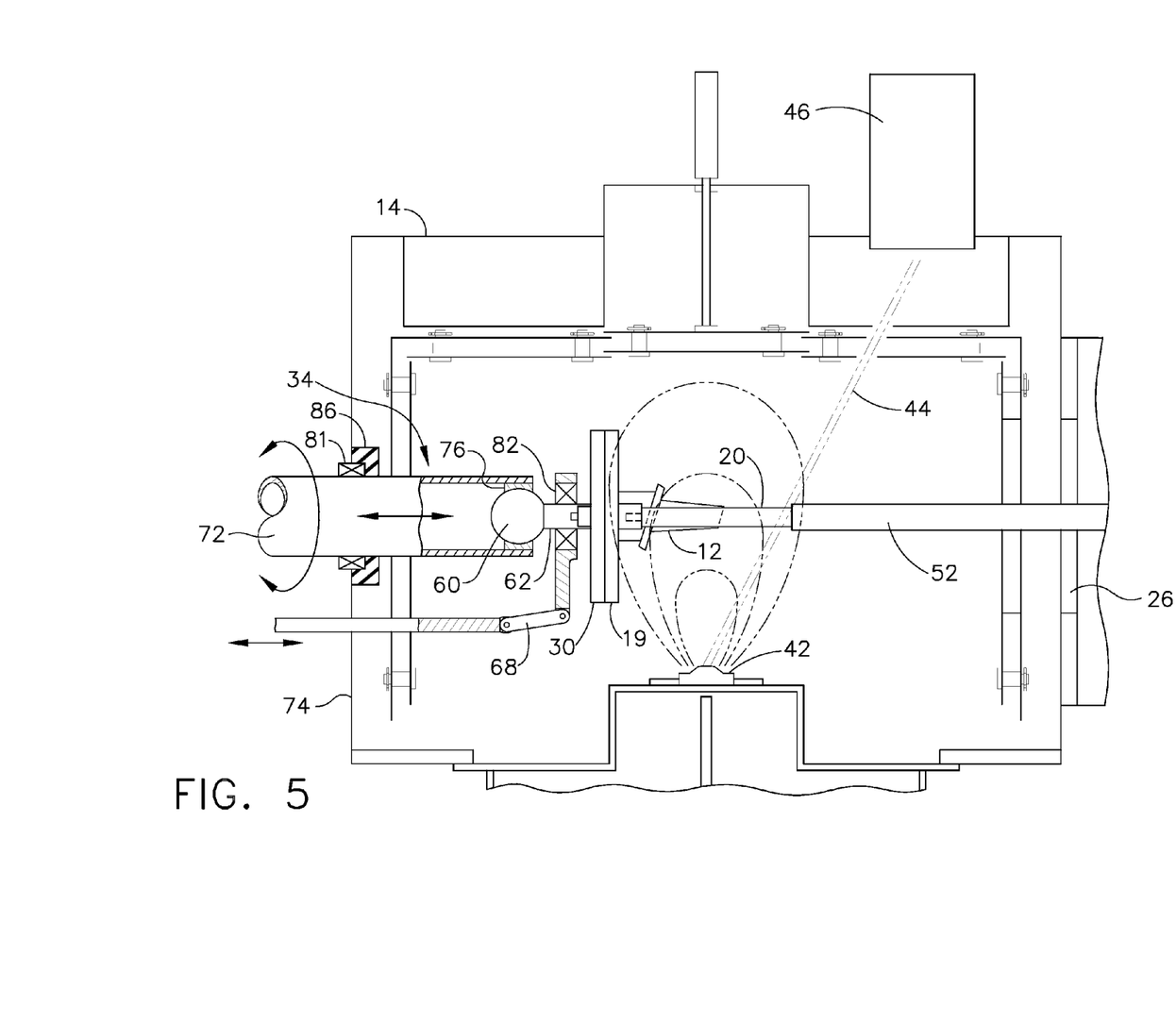
FIG. 5 is an enlarged, front elevation view of the vacuum coating apparatus depicted in FIGS. 1-4, where the workpiece is shown as being disengaged from the mechanism for supporting and manipulating the workpiece.

It will be understood that first linkage mechanism 68 is able to push or pull intermediate member 62 so that workpiece 12 is tilted at an angle 88 to a designated horizontal plane 90 through coating chamber 14. As seen in FIG. 4, workpiece 12 is tilted toward the bottom portion of coating chamber 14 where ingot 42 is located and angle 88 is thus defined as being a negative angle with respect to designated horizontal plane 90. While it typically will be more desirable to tilt workpiece 12 in this manner, it is also possible for first linkage mechanism 68 to tilt workpiece toward the top portion (and away from ingot 42). In which case, angle 88 would be considered to be at a positive angle with respect to designated horizontal plane 90. Thus, the preferred range of tilt for workpiece is for angle 88 to have a range of approximately 75° to approximately −75° and an optimal range of approximately 45° to approximately −45°. It will further be appreciated that tilt angle 88 may remain constant during the coating cycle of a particular workpiece 12, but also may involve a plurality of varying tilt angles. In this way, supporting mechanism 34 is able to manipulate workpiece 12 into a desired position with respect to the coating material emanating from ingot 42.

Figure 8:
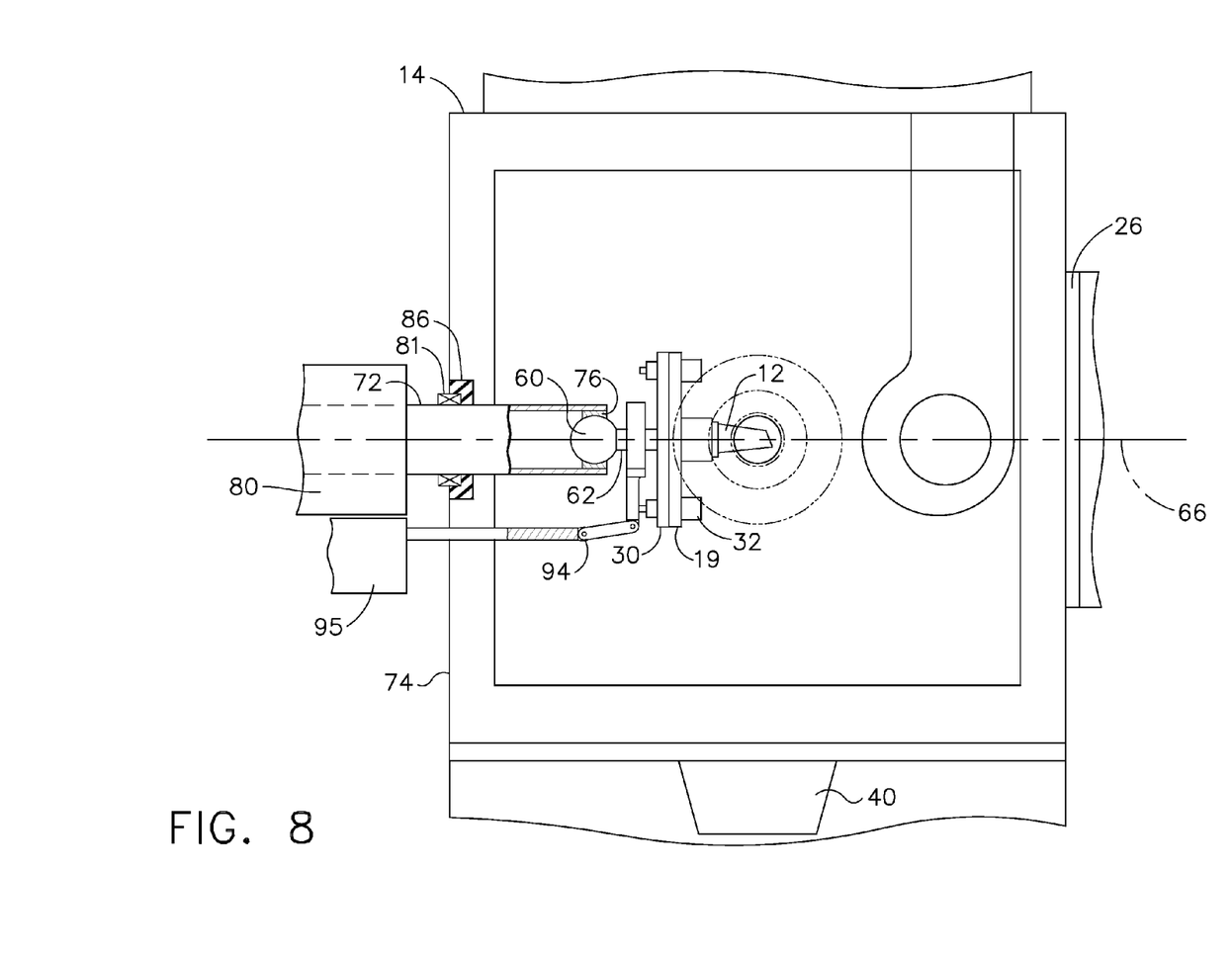
FIG. 8 is an enlarged, partial top plan view of the vacuum coating apparatus depicted in FIGS. 1-5, where a workpiece is shown as being engaged with a second alternative embodiment of the mechanism for supporting and manipulating the workpiece within the coating chamber.
Figure 9:
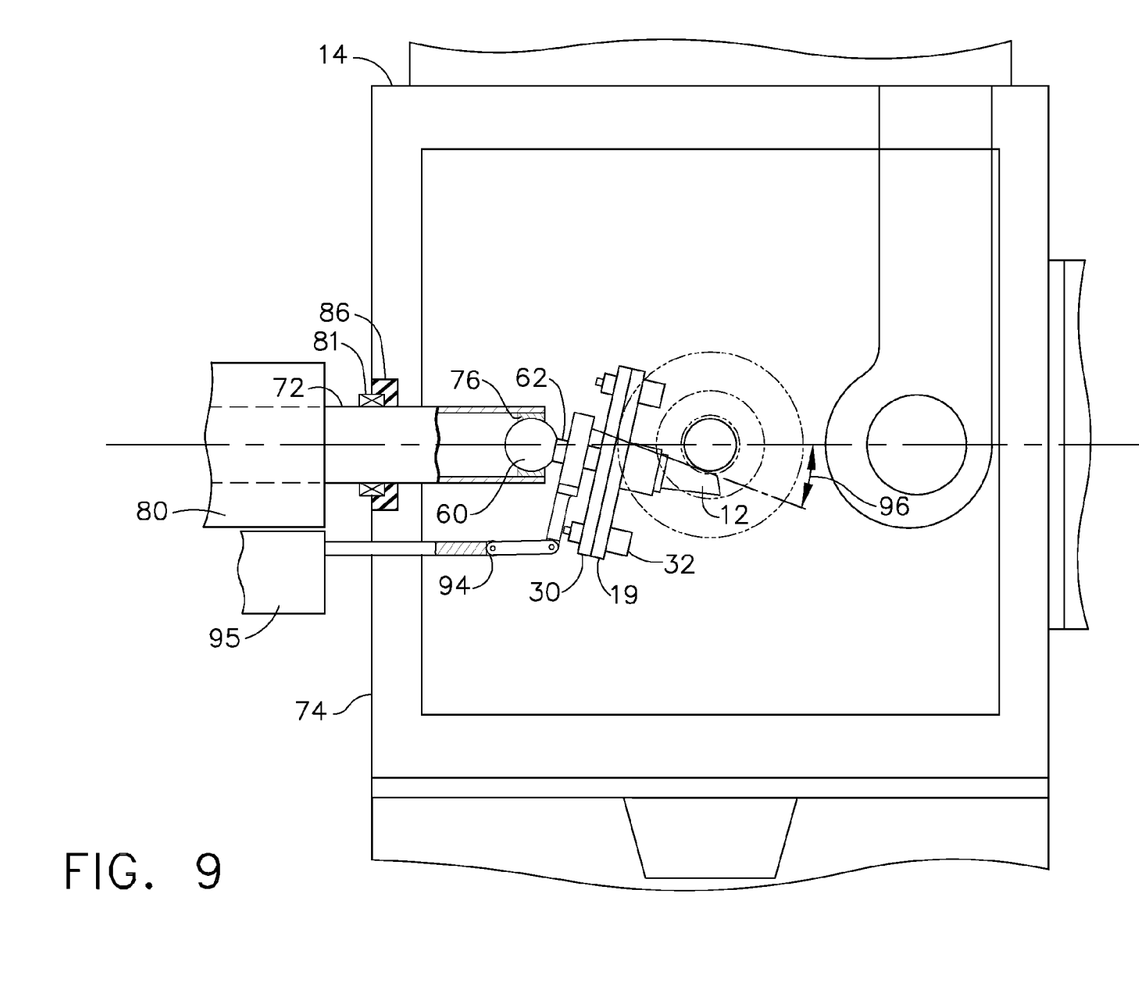
FIG. 9 is an enlarged, partial top plan view of the vacuum coating apparatus depicted in FIG. 8, where the workpiece is shown as being tilted at an angle to a vertical plane through the coating chamber; and, FIG. 10 is an enlarged, partial top view of the mechanism for supporting and manipulating a workpiece depicted in FIGS. 1-5, where a plurality of workpieces are coupled thereto.

It will also be seen from FIGS. 1, 8 and 9 that supporting mechanism 34 may include a device 92 that enables movement of workpiece 12 within designated horizontal plane 90. In particular, device 92 would preferably include a second linkage mechanism 94 (with a corresponding drive system 95) either in addition to or in place of first linkage mechanism 68. As seen therein, second linkage mechanism 94 is preferably connected to intermediate member 62 so that it is able to position workpiece 12 at an angle 96 with respect to designated vertical plane 66. This provides even greater flexibility in the manipulation of workpiece 12 within coating chamber 14. As such, it will be appreciated that workpiece 12 is angled toward a front portion of coating chamber 14 with respect to designated vertical plane 66, which is hereby defined as the positive direction. Workpiece 12 also may be angled toward a rear portion of coating chamber 14 with respect to designated vertical plane 66, or in the negative direction. Second linkage mechanism 94, in conjunction with joint 60, intermediate member 62, and first and second plate members 19 and 30, enables movement of workpiece 12 at angle 96 have a preferred range of approximately 75° to approximately −75° and optimally at a range of approximately 45° to approximately −45°. As discussed hereinabove with respect to tilting of workpiece 12 in designated vertical plane 66, workpiece 12 may remain at a constant angle within designated horizontal plane 90 or move between a plurality of such angles during the coating process for a particular workpiece.

Figure 6:
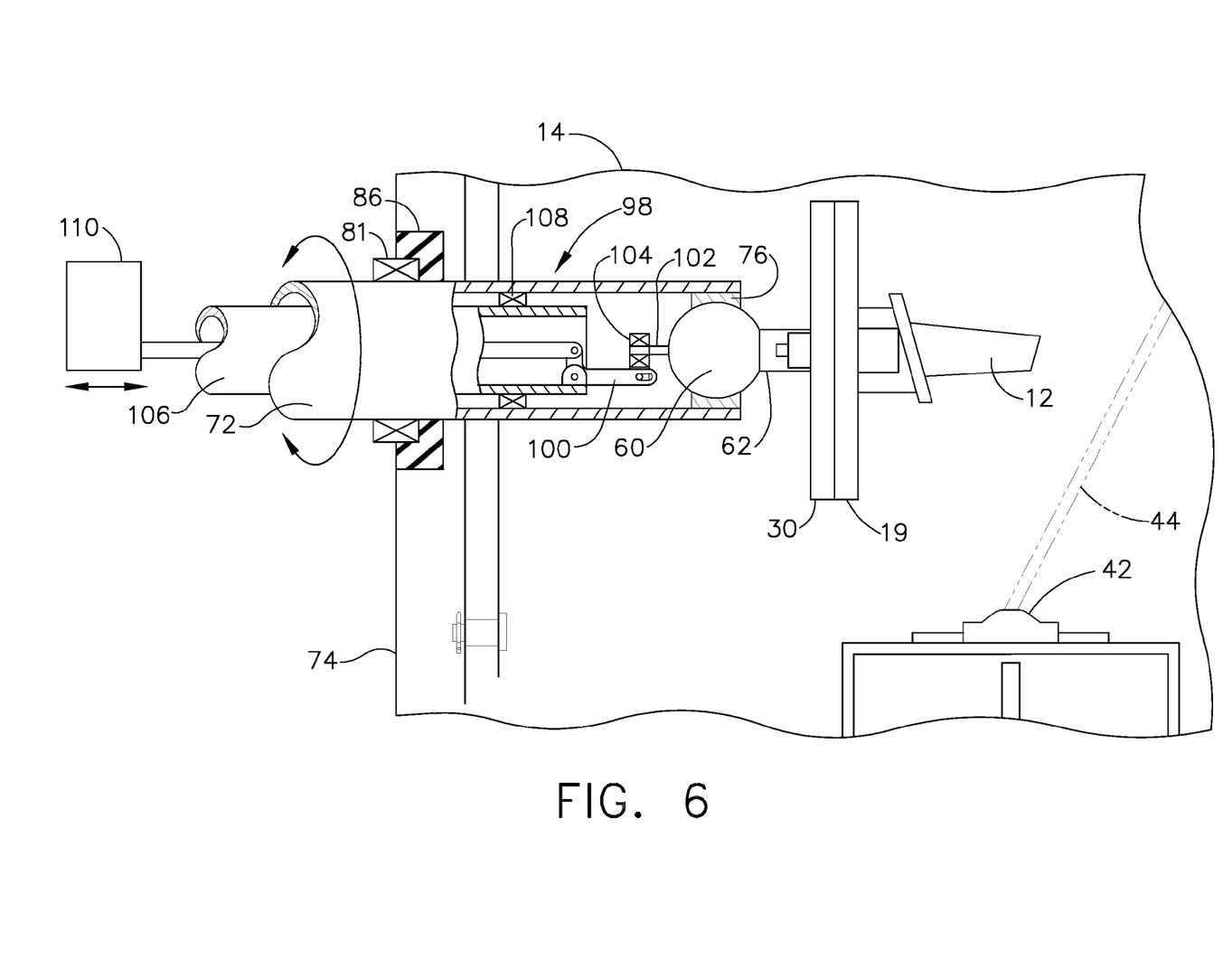
FIG. 6 is an enlarged, partial front elevation view of the vacuum coating apparatus depicted in FIGS. 1-5, where a workpiece is shown as being engaged with a first alternative embodiment of the mechanism for supporting and manipulating the workpiece within the coating chamber.
Figure 7:
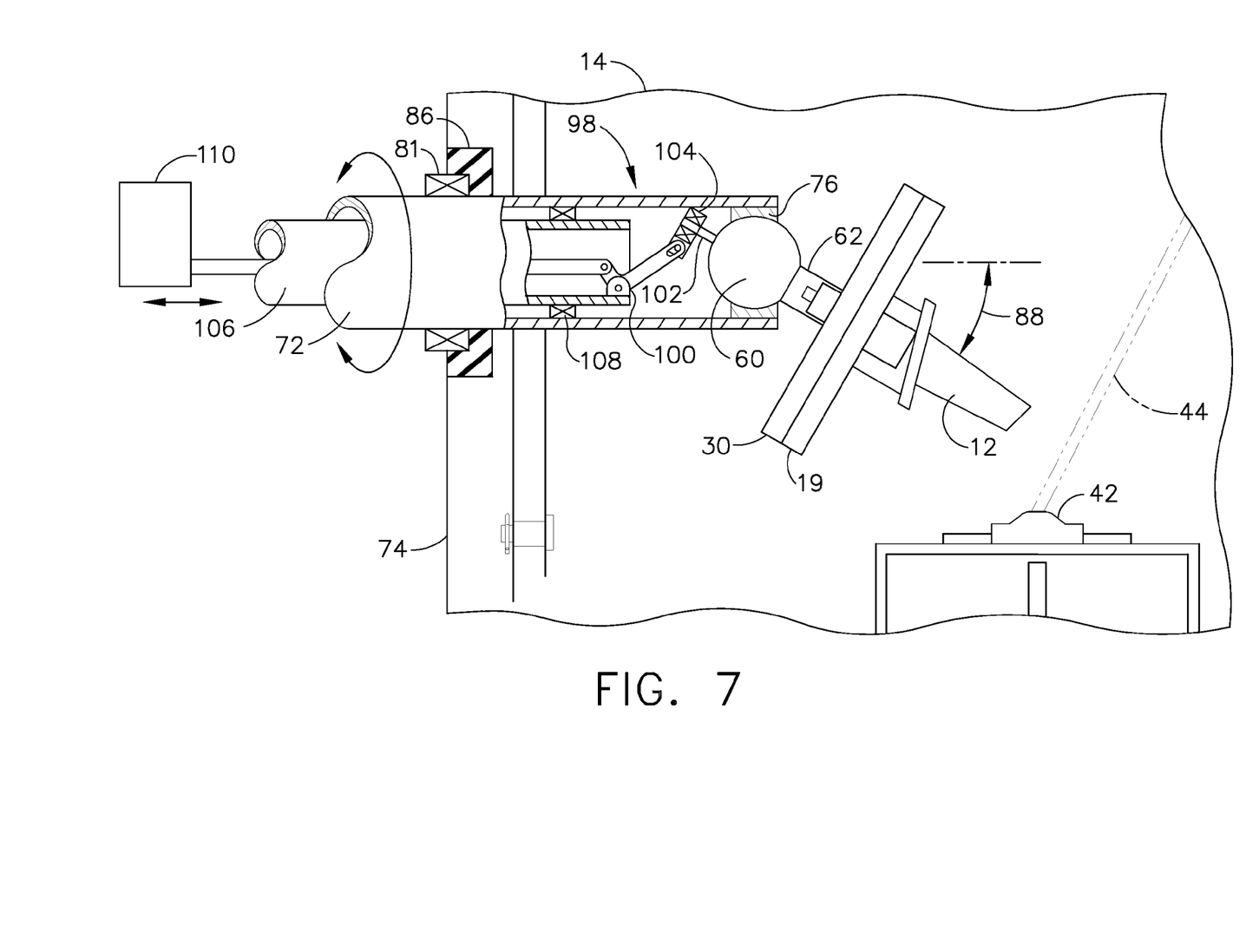
FIG. 7 is an enlarged, partial front elevation view of the vacuum coating apparatus depicted in FIG. 6, where the workpiece is shown as being tilted at an angle to a horizontal plane through the coating chamber.

An alternative embodiment for support mechanism 34 is depicted in FIGS. 6 and 7, where a device 98 is connected to joint 60 for moving workpiece 12 in designated vertical plane 66. More specifically, device 98 preferably includes a linkage mechanism 100 is positioned inside shaft member 72 which interfaces with a pin member 102 connected to and extending from joint 60. A bearing 104 positioned between linkage mechanism 100 and pin member 102. In order to maintain its position, linkage mechanism 100 is preferably located within a second shaft member 106 lying concentrically within shaft member 72. Accordingly, a bearing 108 is positioned between shaft member 72 and second shaft member 106 so that shaft member 72 is able to rotate (and thereby provide this motion to workpiece 12) while second shaft member 106 does not rotate. It will be appreciated that a drive system 110 is associated with linkage mechanism 100 to cause the tilting action to pin member 102. This configuration has the advantage of keeping linkage mechanism 100 out of coating chamber 14. Otherwise, the components of support mechanism 34 previously discussed are identified by the same reference numerals.

Figure 10:
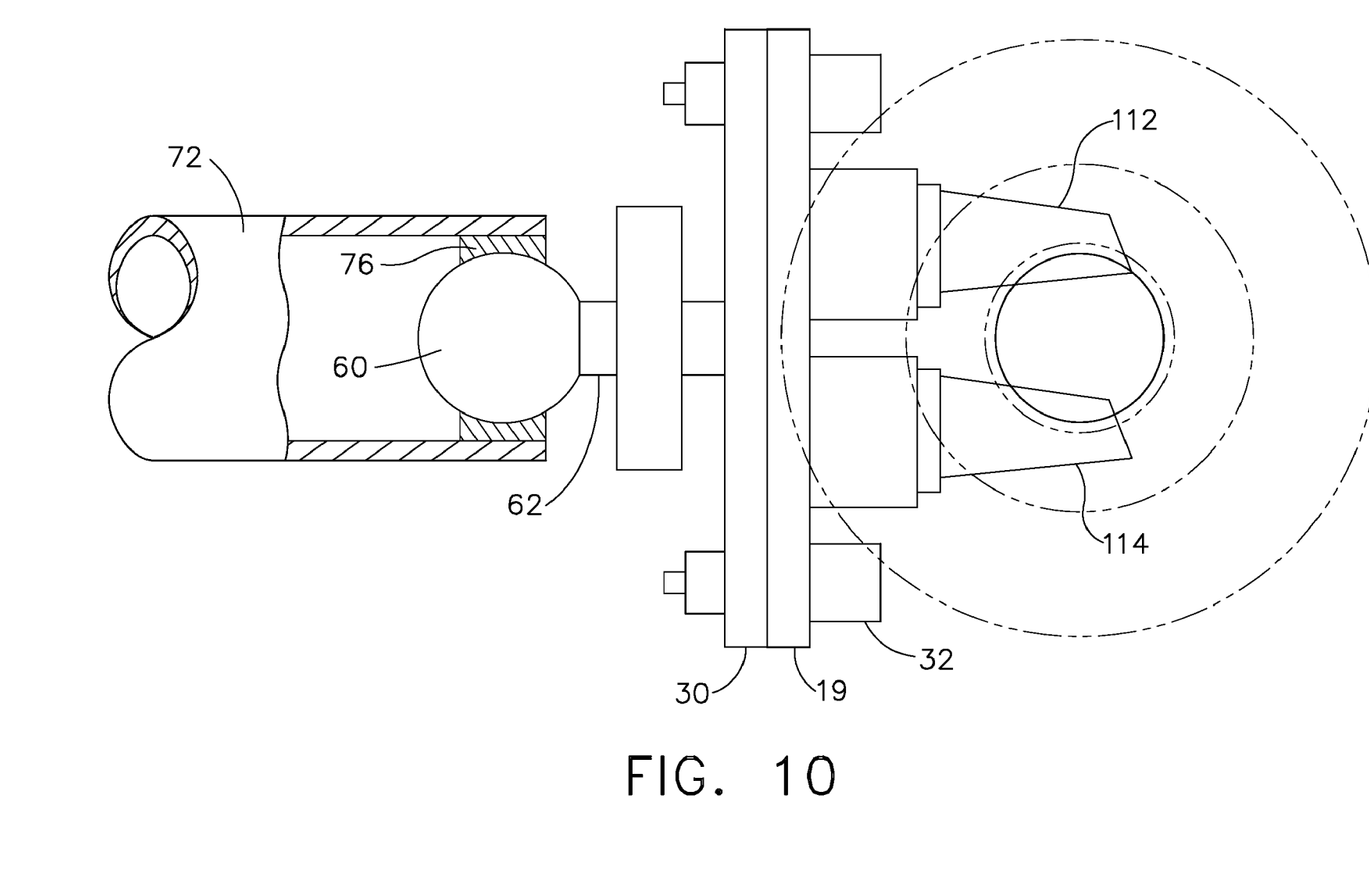

While FIGS. 1-9 depict a single workpiece 12 as undergoing the coating process within coating chamber 14, it will be appreciated that a plurality of workpieces 112 and 114 may be coupled to first plate member 19 (see FIG. 10). The process for coupling first plate member 19 to second plate member 30 of support mechanism 34 will preferably be as detailed herein. Otherwise, the relative position of workpieces 112 and 114 will necessarily be different with respect to the molten pool of coating material and the particle plume emanating therefrom. Generally speaking, workpieces 112 and 114 will be manipulated in tandem since they are coupled to second plate member 30. It will be recognized, however, that modifications could be made to support mechanism 34 to accommodate manipulation of workpieces 112 and 114 individually. Thus, workpieces 112 and 114 may or may not be tilted in the same direction and within the same plane. Further, workpieces 112 and 114 may or may not be rotated and in the same direction.

Having shown and described the preferred embodiment of the present invention, further adaptations of vacuum coating apparatus 10 and support mechanism 34, as well as the process for supporting and manipulating workpieces therein, can be accomplished by appropriate modifications by one of ordinary skill in the art without departing from the scope of the invention. Moreover, it will be understood that mechanism 34 may be utilized with other types of vacuum coating apparatuses not depicted herein.

What is claimed is:

1. An apparatus for providing a vacuum coating to a workpiece, comprising:
   (a) a coating chamber adapted to contain a coating material, said coating chamber being operable at an elevated temperature and a sub-atmospheric pressure;
   (b) an electron beam gun mounted to said coating chamber, said electron beam gun being operable to project an electron beam onto said coating material so as to melt said coating material and to evaporate molten coating material; and,
   (c) a mechanism for supporting and manipulating said workpiece in said coating chamber, comprising:
      (1) a shaft member extending through a wall of said coating chamber and rotatably mounted in a bearing mounted in said wall of said coating chamber;
      (2) a joint connected to an end of said shaft member within said coating chamber, said joint rotatable with the shaft member and operable for tilting movement in at least two mutually perpendicular axes;

(3) an intermediate member extending from said joint, said intermediate member having a central axis;

(4) a rotational drive system disposed outside the coating chamber for rotating said intermediate member, said rotational drive system coupled to the intermediate member through the shaft member and the joint; and (5) a coupling device connected to the intermediate member, the coupling device operable to retain said workpiece; and (6) a first mechanical linkage connected to said intermediate member and to a first drive system disposed outside the coating chamber, said mechanical linkage and first drive system operable to tilt said intermediate member and said workpiece about said joint to a selected tilt angle within a range of tilt in a designated plane, wherein the first mechanical linkage is coupled to the intermediate member through a bearing which permits rotation of said intermediate member about said central axis.

2. The apparatus of claim 1, wherein said workpiece moves in a designated vertical plane.

3. The apparatus of claim 1, wherein said workpiece moves in a designated horizontal plane.

4. The apparatus of claim 1, wherein a centerline axis through said supporting mechanism lies substantially within a single plane.

5. The apparatus of claim 2, wherein said supporting mechanism is able to tilt said workpiece at an angle to a designated horizontal plane through said coating chamber.

6. The apparatus of claim 5, wherein said angle is a negative angle with respect to said designated horizontal plane.

7. The apparatus of claim 5, wherein said angle is a positive angle with respect to said designated horizontal plane.

8. The apparatus of claim 5, wherein said angle is in a range of approximately 45° to approximately −45°.

9. The apparatus of claim 5, wherein said angle is in a range of approximately 75° to approximately −75°.

10. The apparatus of claim 1, wherein said supporting mechanism is able to support and manipulate a plurality of workpieces in said coating chamber.

11. The apparatus of claim 10, wherein said supporting mechanism tilts said workpieces collectively in one direction.

12. The apparatus of claim 10, wherein said supporting mechanism tilts each said workpieces individually in different directions.

13. The apparatus of claim 1, said supporting mechanism further comprising a bearing plate connected to said intermediate member, wherein said bearing plate includes at least one of said coupling devices associated therewith.

14. The apparatus of claim 1, wherein said first drive system is located external to said coating chamber.

15. The apparatus of claim 1, wherein said supporting mechanism is able to manipulate said workpiece into a designated position with respect to said coating material.

16. The apparatus of claim 1, wherein a connection between said intermediate member and said first mechanical linkage occurs inside said coating chamber.

17. The apparatus of claim 1, wherein
a high temperature seal is positioned between said shaft member and said coating chamber wall.

18. The apparatus of claim 3, wherein said supporting mechanism is able to tilt said workpiece at an angle to said designated vertical plane.

19. The apparatus of claim 18, wherein said angle is a negative angle with respect to said designated vertical plane.

20. The apparatus of claim 18, wherein said angle is a positive angle with respect to said designated vertical plane.

21. The apparatus of claim 18, wherein said angle is in a range of approximately 45° to approximately −45°.

22. The apparatus of claim 18, wherein said angle is in a range of approximately 75° 15 to approximately −75°.

23. The apparatus of claim 18, said device further comprising:
(a) a second mechanical linkage connected to said intermediate member; and,
(b) a second drive system disposed outside said coating chamber for controlling said second mechanical linkage;
wherein said second mechanical linkage moves said workpiece to a designated position by moving said intermediate member.

24. The apparatus of claim 1, said device further comprising
a pin member connected to and extending from said joint;
wherein said first mechanical linkage tilts said workpiece to a desired position by moving said joint via said pin member.

* * * * *